(12) United States Patent
Seo

(10) Patent No.: US 11,405,567 B2
(45) Date of Patent: Aug. 2, 2022

(54) DYNAMIC VISION SENSORS CONFIGURED TO CALIBRATE EVENT SIGNALS USING OPTICAL BLACK REGION AND METHODS OF OPERATING THE SAME

(71) Applicant: Samsung Electronics Co., Ltd., Suwon-si (KR)

(72) Inventor: Jong-Seok Seo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 288 days.

(21) Appl. No.: 16/693,591

(22) Filed: Nov. 25, 2019

(65) Prior Publication Data

US 2020/0312899 A1 Oct. 1, 2020

(30) Foreign Application Priority Data

Mar. 28, 2019 (KR) .......................... 10-2019-0036151

(51) Int. Cl.
| | |
|---|---|
| *H04N 5/345* | (2011.01) |
| *H01L 27/146* | (2006.01) |
| *H04N 5/361* | (2011.01) |
| *H04N 5/3745* | (2011.01) |
| *H04N 5/357* | (2011.01) |
| *H04N 5/369* | (2011.01) |
| *H04N 5/378* | (2011.01) |

(52) U.S. Cl.
CPC ..... *H04N 5/3454* (2013.01); *H01L 27/14609* (2013.01); *H01L 27/14623* (2013.01); *H01L 27/14632* (2013.01); *H01L 27/14643* (2013.01); *H01L 27/14687* (2013.01); *H04N 5/361* (2013.01); *H04N 5/3745* (2013.01)

(58) Field of Classification Search
CPC .... H04N 5/3454; H04N 5/361; H04N 5/3745; H04N 5/345; H04N 5/357; H04N 5/36963; H04N 5/378; H04N 5/3456; H01L 27/14609; H01L 27/14623; H01L 27/14632; H01L 27/14643; H01L 27/14687; H01L 27/14625
USPC .................................................. 348/243, 245
See application file for complete search history.

(56) References Cited

U.S. PATENT DOCUMENTS

| | | |
|---|---|---|
| 6,903,768 B1 | 6/2005 | Ohsawa et al. |
| 8,189,077 B2 | 5/2012 | Peng et al. |
| 9,124,829 B2 | 9/2015 | Patel |

(Continued)

*Primary Examiner* — Albert H Cutler
(74) *Attorney, Agent, or Firm* — Harness, Dickey & Pierce, P.L.C.

(57) ABSTRACT

A dynamic vision sensor including a dynamic vision sensor pixel array including an active region and an optical black region, the active region configured to output a plurality of first signals corresponding to a plurality of first events indicating a change in an intensity of light, the optical black region configured to output a plurality of second signals corresponding to a plurality of second events not indicating the change in the intensity of light, and processing circuitry configured to, generate a plurality of event signals based on the plurality of first signals, generate a plurality of noise signals based on the plurality of second signals, calculate a value representing real events among the plurality of first events based on the plurality of event signals and the plurality of noise signals, and selectively output the plurality of event signals based on the value representing real events and a threshold value.

20 Claims, 14 Drawing Sheets

(56) References Cited

U.S. PATENT DOCUMENTS

| | | |
|---|---|---|
| 9,681,081 B2 | 6/2017 | Serrano Gotarredona et al. |
| 2007/0023614 A1* | 2/2007 | Park ................... H04N 3/1568 |
| | | 250/214.1 |
| 2008/0192130 A1 | 8/2008 | Noh |
| 2016/0093273 A1 | 3/2016 | Wang et al. |
| 2016/0094787 A1* | 3/2016 | Govil .................. H04N 5/3745 |
| | | 348/310 |
| 2017/0241774 A9 | 8/2017 | Brandli et al. |
| 2018/0167570 A1* | 6/2018 | Suh ...................... H04N 5/361 |
| 2018/0191972 A1 | 7/2018 | Berner et al. |
| 2020/0297294 A1* | 9/2020 | Tuch .................... A61B 6/425 |

* cited by examiner

DYNAMIC VISION SENSORS CONFIGURED TO CALIBRATE EVENT SIGNALS USING OPTICAL BLACK REGION AND METHODS OF OPERATING THE SAME

CROSS-REFERENCE TO RELATED APPLICATIONS

This application claims priority under 35 U.S.C. § 119 to Korean Patent Application No. 10-2019-0036151 filed on Mar. 28, 2019, in the Korean Intellectual Property Office, the disclosures of which are incorporated by reference herein in their entireties.

BACKGROUND

Some example embodiments described herein relate to dynamic vision sensors, and more particularly, relate to dynamic vision sensors configured to calibrate event signals by using an optical black region.

In general, an image sensor may be classified as an image sensor operating asynchronously or an image sensor operating synchronously. A complementary metal-oxide-semiconductor (CMOS) image sensor is a typical example of an image sensor operating synchronously. A dynamic vision sensor is a typical example of an image sensor operating asynchronously.

The dynamic vision sensor detects a change in the intensity of light due to a movement of an object and generates an event. Therefore, unlike a general CMOS image sensor, when an object does not move (e.g., when the intensity of light does not change), no information is provided to a user. In contrast, when an object is moving, because the intensity of light changes mainly at a boundary or an outline of the object, an image associated with a silhouette of the object is provided to the user.

However, in some cases, an unintended event may be output from a pixel of the dynamic vision sensor due to various factors, in addition to the change in the intensity of light corresponding to a movement of an object. This unintended event distorts information to be provided to the user. In addition, the unintended event may increase a workload of a processor that processes event signals. Therefore, it would be desirable to efficiently remove unintended events.

SUMMARY

Some example embodiments provide a device and a method capable of determining whether events occurring in an active area come from noise.

According to some example embodiments, a dynamic vision sensor includes a dynamic vision sensor pixel array including an active region and an optical black region, the active region configured to output a plurality of first signals corresponding to a plurality of first events indicating a change in an intensity of light, and the optical black region configured to output a plurality of second signals corresponding to a plurality of second events not indicating the change in the intensity of light, and processing circuitry configured to, generate a plurality of event signals based on the plurality of first signals, generate a plurality of noise signals based on the plurality of second signals, calculate a value representing real events among the plurality of first events based on the plurality of event signals and the plurality of noise signals, and selectively output the plurality of event signals based on the value representing real events and a threshold value.

According to some example embodiments, a dynamic vision sensor including a dynamic vision sensor pixel array including a plurality of active regions and a plurality of optical black regions, each active region among the plurality of active regions including a plurality of first pixels, and each optical black region among the plurality of optical black regions including a plurality of second pixels, and processing circuitry configured to, generate a plurality of event signals based on a plurality of first events detected by the plurality of first pixels of a first active region among the plurality of active regions, generate a plurality of noise signals based on a plurality of second events detected by the plurality of second pixels of a first optical black region among the plurality of optical black regions, determine a number of first events included in the plurality of first events based on the plurality of event signals, determine a number of second events included in the plurality of second events based on the plurality of noise signals, perform a subtraction operation on the number of first events and one of the number of second events or a reference decrease value to generate a value representing real events among the plurality of first events, and selectively output the plurality of event signals based on the value representing real events and a threshold value.

According to some example embodiments, a method of operating a dynamic vision sensor which includes an active region and an optical black region. The method includes detecting, by the active region, a plurality of first events indicating a change in an intensity of light, detecting, by the optical black region, a plurality of second events not indicating the change in the intensity of light, generating a plurality of event signals based on the plurality of first events, generating a plurality of noise signals based on the plurality of second events, determining real events among the plurality of first events by performing a subtraction operation based on the plurality of event signals and the plurality of noise signals, and selectively output the plurality of event signals based on a result of the determining and a threshold value.

BRIEF DESCRIPTION OF THE FIGURES

The above and other objects and features of some example embodiments will become apparent by describing in detail examples thereof with reference to the accompanying drawings.

DETAILED DESCRIPTION

Below, some example embodiments may be described in detail and clearly to such an extent that one of ordinary skill in the art may easily implements the same.

Components that are described in the detailed description with reference to the terms "unit", "module", "block", "~er or ~or", etc. and function blocks illustrated in drawings will be implemented with processing circuitry. The term 'processing circuitry,' as used in the present disclosure, may refer to, for example, hardware (such as logic circuits), a hardware/software combination (such as a processor executing software), or a combination thereof. In some example embodiments, the software may be a machine code, firmware, an embedded code, and/or application software. For example, the processing circuitry more specifically may include, but is not limited to a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), a processor, a computer, etc. Additional hardware that may be used to implement the components and function blocks includes an electrical circuit, an electronic circuit, an integrated circuit, integrated circuit cores, a pressure sensor, an inertial sensor, a microelectromechanical system (MEMS), a passive element, or a combination thereof.

Figure 1:
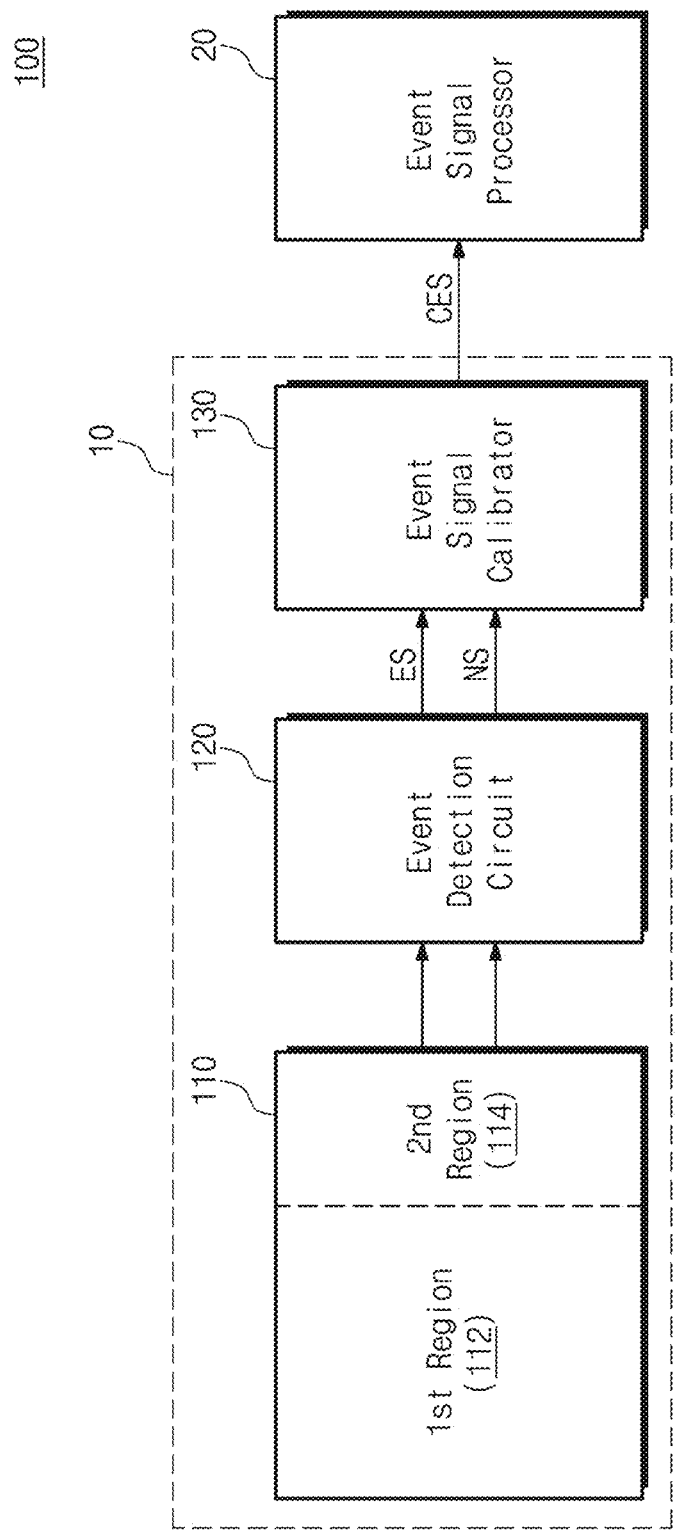
FIG. 1 illustrates an electronic device according to some example embodiments.

FIG. 1 illustrates an electronic device 100 according to some example embodiments.

The electronic device 100 includes a dynamic vision sensor (DVS) 10 and/or an event signal processor 20. For example, the electronic device 100 may be implemented with one or more electronic devices such as a desktop computer, a laptop computer, a tablet, a smartphone, a wearable device, a smart speaker, home security Internet of Things (IoT), a video game console, a workstation, a server, and/or an autonomous driving vehicle.

The dynamic vision sensor 10 may sense a change in the intensity of light. For example, the dynamic vision sensor 10 may detect an event that the intensity of light increases and/or an event that the intensity of light decreases. The dynamic vision sensor 10 may generate a signal based on the detected intensity change, may process the generated signal, and may provide a result of the processing to the user. In some example embodiments, the dynamic vision sensor 10 may include a DVS pixel array 110, an event detection circuit 120, and/or an event signal calibrator 130. According to some example embodiments, operations described herein as being performed by the dynamic vision sensor 10, the event signal processor 20, the event detection circuit 120 and/or the event signal calibrator 130 may be performed by processing circuitry.

The DVS pixel array 110 may include a first region 112 and a second region 114. The first region 112 may detect an increase or decrease in the intensity of light as an event and may output a signal corresponding to the detected event. The second region 114 may not be affected by the change in the intensity of light. Therefore, the second region 114 may not output a signal corresponding to the change in the intensity of light. Instead, the second region 114 may output a signal based on noise that occurs due to interference by light incident on the first region 112, hot electrons generated according to an operation of the electronic device 100, any other factors from the outside, etc. (hereinafter collectively referred to as noise). For example, the first region 112 may be an active region, and the second region 114 may be an optical black region. For example, a pixel of the first region 112 and a pixel of the second region 114 may have the same or substantially the same structure.

The event detection circuit 120 may generate an event signal and/or a noise signal based on a signal from the DVS pixel array 110. In some example embodiments, the event signal may be based on a signal that is output from the first region 112. For example, the event signal may include information that is associated with an attribute (e.g., an increase or decrease in the intensity of light) of a real event occurring due to a change of a light when an object moves, and a time when the event occurs. In contrast, the noise signal may be based on a signal that is output from the second region 114. For example, the noise signal may include information that is associated with an attribute of noise and a time when the noise occurs.

The event signal calibrator 130 may receive an event signal ES and a noise signal NS. The event signal calibrator 130 may compare the number of event signals, which are based on events detected by pixels of the first region 112, with a specific threshold value based on the noise signal NS. The event signal calibrator 130 may block event signals, which are determined as a ratio of noise is relatively great, from among the events detected by the pixels of the first region 112, based on a result of the comparison. A signal that is output from the event signal calibrator 130 may be provided to the event signal processor 20 as a calibrated event signal CES.

Noise that is output from the first region 112 may be efficiently filtered by the above operations performed by the event signal calibrator 130. As such, the amount of data to be processed by the event signal processor 20 may decrease. Thus, the performance of the electronic device 100 may be improved (e.g., event processing speed may decrease) and/or power consumption may decrease. An operation of the event signal calibrator 130 will be described in detail below.

The event signal processor 20 may generate an image to be provided to the user, based on a signal output from the event signal calibrator 130. The event signal processor 20 may perform various processing on the signal output from the event signal calibrator 130. For example, as is well known, the event signal processor 20 may calibrate a timestamp value of a noise pixel, a hot pixel, and/or a dead pixel by using a temporal correlation between timestamp values of adjacent pixels of the dynamic vision sensor 10.

Figure 2A:
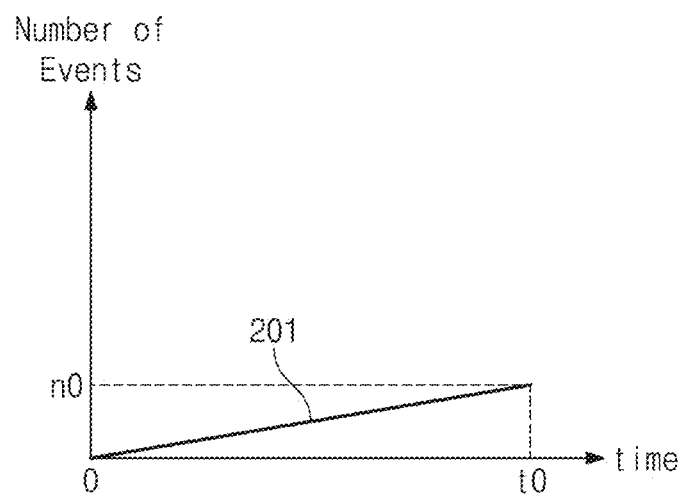
FIG. 2A is a graph illustrating accumulation of events output from a second region of FIG. 1 over time.

FIG. 2A is a graph illustrating accumulation of events output from the second region 114 of FIG. 1 over time.

As described above, the second region 114 (refer to FIG. 1) is configured such that a light incident from the outside is blocked. Thus, the second region 114 may not directly detect a change in the intensity of light. Instead, the second region 114 may output a signal due to interference by the light incident on the first region 112 (refer to FIG. 1), hot electrons generated according to an operation of an electronic device, noise and so on (e.g., an event). That is, the event related to the first region 112 and the event related to the second region 114 may be different from each other. An example is illustrated in FIG. 2A as "n0" events are output from 0 to t0. In some example embodiments, referring to graph 201, the number of events that are output from the first region 112 may increase linearly over time.

Figure 2B:
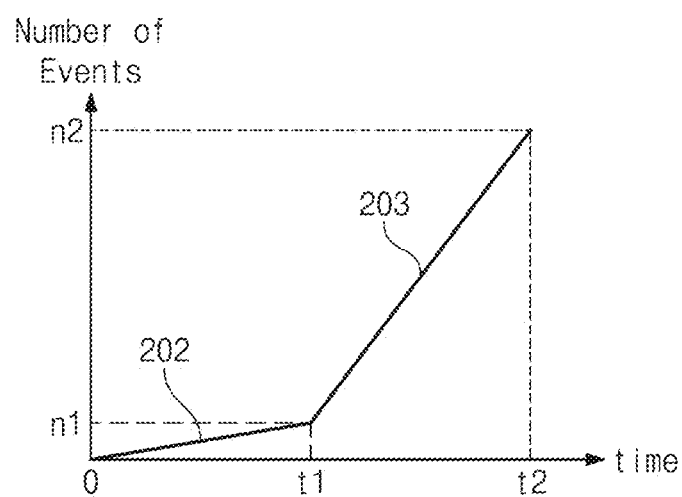
FIG. 2B is a graph illustrating accumulation of events detected by a first region of FIG. 1 over time.

FIG. 2B is a graph illustrating accumulation of events detected by the first region 112 of FIG. 1 over time.

An example is illustrated in FIG. 2B as "n1" events are detected from 0 to t1 and (n2−n1) events are additionally detected from t1 to t2. Graph 202 may be associated with events due to noise, not a real event occurring according to a movement of an object. In contrast, graph 203 may be associated with real events detected as the intensity of light varies. That is, a period from 0 to t1 may be a period where a movement of an object is not detected, and a period from t1 to t2 may be a period where a movement of an object is detected.

Some example embodiments are briefly described with reference to FIG. 1 as a signal that is output from the first region 112 and is determined as noise is blocked based on a signal output from the second region 114. This is based on the assumption that the first region 112 and the second region 114 have the same or similar characteristics. That is, it is assumed that the number of noises output (e.g., the number of times an indication of detected noise is output) from pixels of the first region 112 per unit time is the same as or similar to the number of noises output from pixels of the second region 114 per unit time. In addition, it is assumed that a profile of graph 201 of FIG. 2A is the same or mostly the same as a profile of graph 202 of FIG. 2B.

Figure 3:
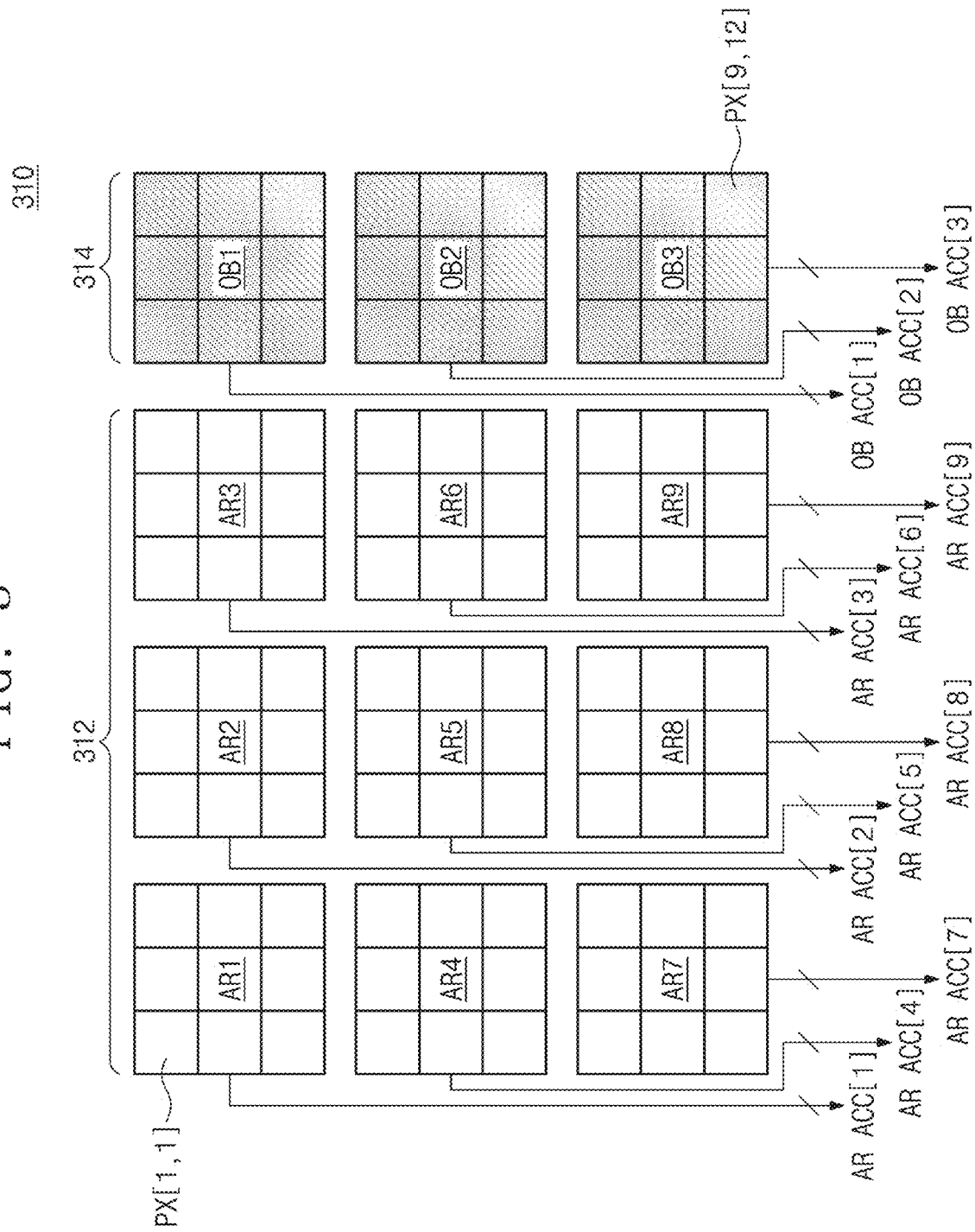
FIG. 3 conceptually illustrates a method of calibrating event signals, according to some example embodiments.

FIG. 3 conceptually illustrates a method of calibrating event signals, according to some example embodiments. For better understanding, a description will be given with reference to FIG. 1 together.

A DVS pixel array 310 may include a first region 312 and a second region 314. The DVS pixel array 310 corresponds to the DVS pixel array 110 of FIG. 1. The first region 312 may be divided into a plurality of active regions each including a plurality of pixels. For example, the first region 312 may be divided into a first active region AR1 to a ninth active region AR9 (e.g., the first active region AR1, the second active region AR2, the third active region AR3, the fourth active region AR4, the fifth active region AR5, the sixth active region AR6, the seventh active region AR7, the eighth active region AR8 and the ninth active region AR9). As in the above description, the second region 314 may be divided into a first optical black region OB1 to a third optical black region OB3.

The first active region AR1 may include nine pixels. In some example embodiments, the first active region AR1 includes a pixel PX[1, 1] at the first row and first column, and eight surrounding (e.g., associated) pixels. As in the above description, the third optical black region OB3 include a pixel PX[9, 12] at the ninth row and twelfth column, and eight surrounding pixels. However, the number of pixels that each active region includes may be different from the above example. In addition, the second region 314 is illustrated as being adjacent to a right side of the first region 312, but may be placed at various positions of the DVS pixel array 310.

The event detection circuit 120 may generate an event signal based on signals corresponding to an event (e.g., an event indication) output by each pixel of the first region 312. The event detection circuit 120 may generate a noise signal based on signals corresponding to an event (e.g., an event indication) output by each pixel of the second region 314. The event signal may include information about an attribute of the event that occurs and a time when the event occurs.

The event signal calibrator 130 may count the number of events detected by pixels of each active region during a unit time (e.g., a duration). In some example embodiments, the event signal calibrator 130 may count event signals based on signals output from the nine pixels of the first active region AR1 to generate a counting signal AR ACC[1]. This counting may be identically or similarly performed on the remaining active regions AR2 to AR9.

Also, the event signal calibrator 130 may count the number of noise signals based on signals (e.g., event indicators) output from pixels of each optical black region during the unit time. In some example embodiments, the event signal calibrator 130 may count events (e.g., event indicators) output from the nine pixels of the first optical black region OB1 to generate a counting signal OB ACC[1]. This counting may be identically or similarly performed on the remaining optical black regions OB2 and OB3. Alternatively, this counting may not be performed on the remaining optical black regions OB2 and OB3.

Regardless of a change in the intensity of light, counting signals OB ACC[1] to OB ACC[3] may be generated based on the signals output from the optical black regions OB1 to OB3; because the pixels of the first region 312 and the second region 314 have the same or substantially the same structure, noise corresponding to the counting signals OB ACC[1] to OB ACC[3] may be considered as being already applied to counting signals AR ACC[1] to AR ACC [9]. In other words, signals output from each optical black region correspond to noise, and signals output from each active region correspond to the noise and a real event. According to some example embodiments, each first active region may have an identical number of pixels as or a similar number of pixels as each optical black region.

According to some example embodiments, the event signal calibrator 130 may generate a reference decrease value from the counting signals OB ACC[1] to OB ACC[3]. The reference decrease value may correspond to the number of signals, which come from noise, from among signals output from pixels of each active region. In some example embodiments, the reference decrease value may be an average value of the counting signals OB ACC[1] to OB ACC [3]. Alternatively, the reference decrease value may be the maximum (e.g., highest) value or the minimum (e.g., lowest) value of the counting signals OB ACC[1] to OB ACC[3].

The event signal calibrator 130 may subtract the reference decrease value from each of the counting signals AR ACC [1] to AR ACC[9]. The event signal calibrator 130 may compare a result value of the subtraction with a threshold value. When the result value of the subtraction is greater than the threshold value, events output from an active region may be considered as real events (e.g., true events). In contrast, when the result value of the subtraction is smaller than the threshold value, events output from an active region may be considered as events that mostly come from noise (e.g., false events). In this case, the event signal calibrator 130 may block a signal related to false events (that is, noise-based events) output from the active region. That is, because the blocked events are not provided to the event signal processor 20 (refer to FIG. 1), a speed at which the event signal processor 20 processes events may be improved (e.g., decreased).

Figure 4:
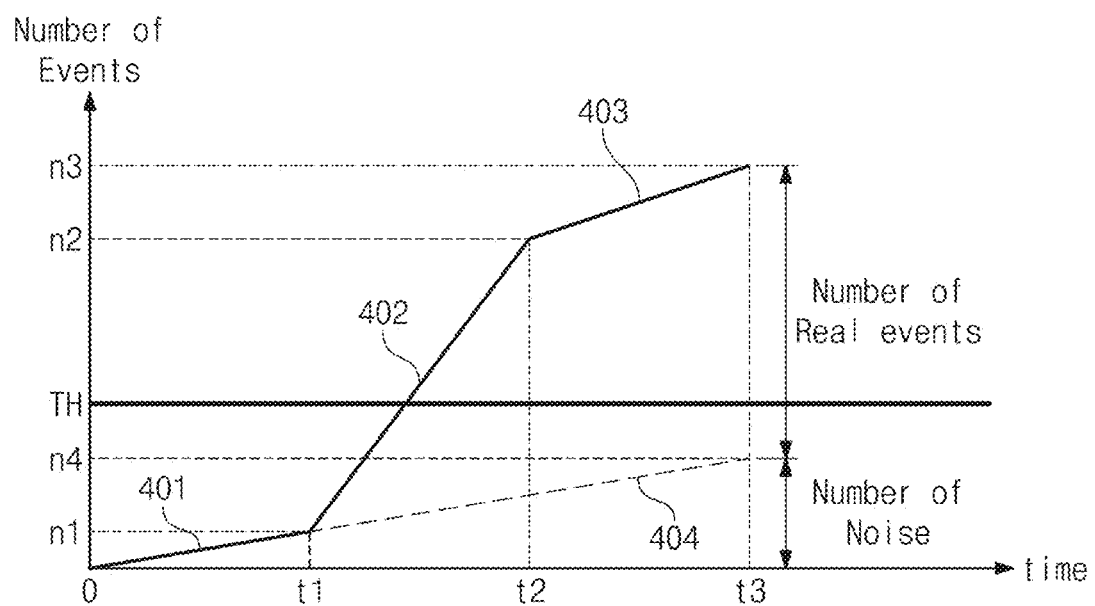
FIG. 4 is a graph conceptually illustrating a process of calibrating event signals, according to some example embodiments.

FIG. 4 is a graph conceptually illustrating a process of calibrating event signals, according to some example embodiments.

For convenience of description, it is assumed that a movement of an object is absent within a period from 0 to t1, a movement of an object within a period from t1 to t2 is relatively large, and a movement of an object within a period from t2 to t3 is relatively small.

Within the period from 0 to t1, even though a movement of an object is not detected, signals corresponding to "n" events due to noise and so on may be output from an active region (e.g., any one of AR1 to AR9 of FIG. 3). Graph 401 shows that output events are accumulated over time.

During the period from t1 to t2, because a relatively large movement of the object is detected, the number of events may sharply increase, and (n2−n1) events may be output from each active region. Events that are output from the active region within the period from t1 to t2 include real events coming from the movement of the object and events coming from noise. Graph 402 shows that output events are accumulated over time.

Within the period from t2 to t3, because a relatively small movement of the object is detected, the number of events may smoothly increase, and (n3−n2) events may be output from the active region. Events that are output from the active region within the period from t1 to t3 include real events coming from the movement of the object and events coming from noise. Graph 403 shows that output events are accumulated over time.

Because noise continuously occurs in a period where real events corresponding to the movement of the object occur and in a period where real events do not occur, events coming from noise may be linearly accumulated over time, and graph 404 shows this accumulation of events coming from noise. That is, a slope of graph 401 may be the same as or similar to a slope of graph 404.

The event signal calibrator 130 may calculate a difference between the number (e.g., n3) of real events occurring in each active region and the number (e.g., n4) of false events and compare the calculated difference and a threshold value TH. For example, when the calculated difference is greater than the threshold value TH, event signals output from an active region are considered as real events coming from a movement of an object. In contrast, when the calculated difference is smaller than the threshold value TH, the event signals output from the active region are considered as events coming from noise that is not associated with a movement of an object.

In some example embodiments, the threshold value TH may be a value that is designated in advance. In some example embodiments, the threshold value TH may be a value that is measured in real time. In this case, the threshold value TH may be the number (e.g., n4) of false events occurring during a unit time (e.g., 0 to t3). In some example embodiments, the threshold value TH may be a value that is variable by the user. For example, in the case where an electronic device (e.g., the electronic device 100 of FIG. 1) operates in a low-power mode, a magnitude of the threshold value TH may become relatively high. In this case, because the number of events to be processed decreases, a speed at which an electronic device processes events may further increase, and power consumption may further decrease.

Figure 5:
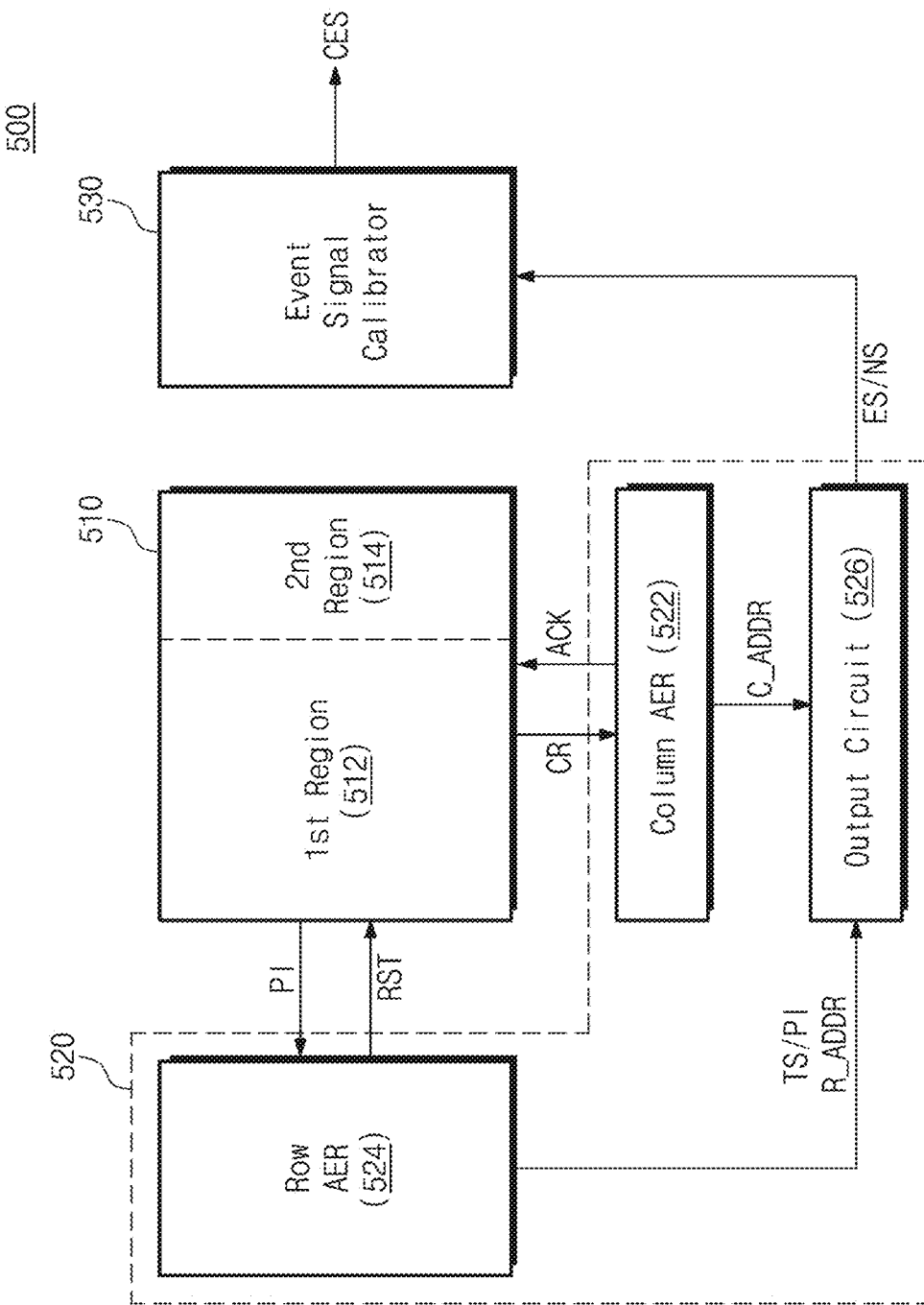
FIG. 5 illustrates an example configuration of a dynamic vision sensor illustrated in FIG. 1.

FIG. 5 illustrates an example configuration of the dynamic vision sensor 10 illustrated in FIG. 1.

A dynamic vision sensor 500 may include a DVS pixel array 510, an event detection circuit 520, and/or an event signal calibrator 530. The event detection circuit 520 may include a column address event representation (AER) circuit 522, a row AER circuit 524, and/or an input/output circuit 526. According to some example embodiments, operations described herein as being performed by the column AER circuit 522, the row AER circuit 524 and/or the input/output circuit 526 may be performed by processing circuitry.

The DVS pixel array 510 may include a plurality of pixels arranged along a plurality of rows and a plurality of columns in the form of a matrix. As described above, the DVS pixel array 510 may include a first region 512 including a plurality of active regions and a second region 514 including a plurality of optical black regions. A pixel detecting an event from among the plurality of pixels of the DVS pixel array 510 may output a signal (e.g., a column request) CR indicating that the event that the intensity of light increases or decreases occurs, to the column AER circuit 522. Here, the column request CR may be associated with a real event detected in the first region 512 or may be associated with noise occurring in the first region 512 or the second region 514.

The column AER circuit 522 may output an acknowledge signal ACK to the pixel, which the event outputs, in response to the column request CR received from the pixel. The pixel that receives the acknowledge signal ACK may output polarity information PI of the event to the row AER circuit 524. The polarity information PI may include information for identifying the event that the intensity of light increases or decreases. The column AER circuit 522 may generate a column address C_ADDR of the pixel detecting the event, based on the column request CR received from the pixel detecting the event.

The row AER circuit 524 may receive the polarity information PI from the pixel detecting the event. The row AER circuit 524 may generate a timestamp TS including information about a time when the event occurs, based on the polarity information PI. In some example embodiments, the timestamp TS may be generated by a time stamper provided in the row AER circuit 524. For example, the time stamper may be implemented by using a timetick that is generated in units of several microseconds to tens of microseconds. The row AER circuit 524 may output a reset signal RST to the pixel where the event occurs, in response to the polarity information PI. The pixel where the event occurs may be reset by the reset signal RST. In addition, the row AER circuit 524 may generate a row address R_ADDR of the pixel where the event occurs.

The row AER circuit 524 may control a period where the reset signal RST is generated. For example, to prevent a workload from increasing due to occurrence of a lot of events, or to reduce an amount of the increase, the row AER circuit 524 may control a period where the reset signal RST is generated, such that an event does not occur during a specific period. That is, the row AER circuit 524 may control a refractory period of occurrence of the event.

The input/output circuit 526 may generate the event signal ES or the noise signal NS based on the timestamp TS, the column address C_ADDR, the row address R_ADDR, and/or the polarity information PI. The input/output circuit 526 may add a header indicating a start of transmission of a signal at the front of the event signal ES or the noise signal NS and a tail indicating an end of transmission of a signal at the rear thereof.

Figure 6:
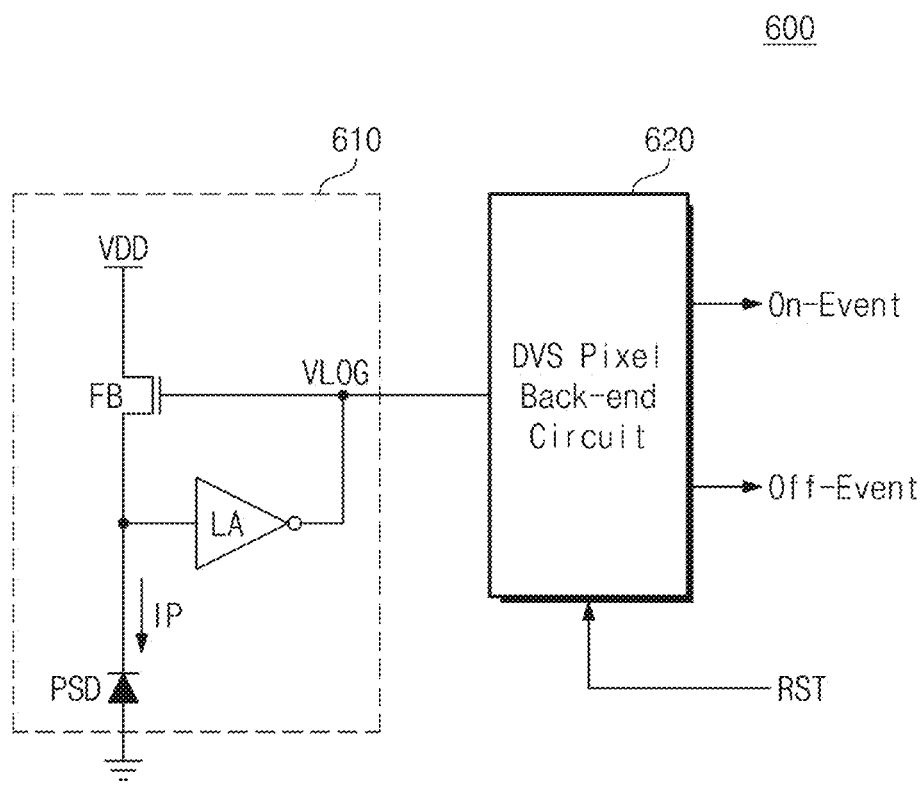
FIG. 6 is a circuit diagram illustrating an example configuration of a DVS pixel of a DVS pixel array of FIG. 5.

FIG. 6 is a circuit diagram illustrating an example configuration of a DVS pixel of a DVS pixel array of FIG. 5.

A DVS pixel 600 is configured to detect a change in the intensity of light and to output a signal corresponding to the detected intensity change. The DVS pixel 600 may include a photoreceptor 610 and a DVS pixel back-end circuit 620. A DVS pixel of an optical black region of the second region 514 (refer to FIG. 5) may have the same structure as or a similar structure to a DVS pixel of an active region of the first region 512 (refer to FIG. 5). However, the DVS pixel of the optical black region may be implemented not to receive a light.

The photoreceptor 610 may include a photoelectric conversion element PSD, a logarithmic amplifier LA, and/or a feedback transistor FB. The photoelectric conversion element PSD may generate photoelectrons in response to an incident light. That is, the photoelectric conversion element PSD may convert a light signal to an electrical signal to generate a photocurrent IP. For example, the photoelectric conversion element PSD may include a photodiode, a photo transistor, a pinned photodiode, and/or any other similar element. The logarithmic amplifier LA may amplify a voltage corresponding to the photocurrent IP that is generated by the photoelectric conversion element PSD of the DVS pixel 600. The logarithmic amplifier LA may output a log voltage VLOG of a logarithmic scale. The feedback transistor FB may separate the photoreceptor 610 from the DVS pixel back-end circuit 620.

The DVS pixel back-end circuit 620 may perform various processing on the log voltage VLOG. In some example embodiments, the DVS pixel back-end circuit 620 may amplify the log voltage VLOG, may determine a change in the intensity of light incident on the photoelectric conversion element PSD by comparing the amplified voltage and a reference voltage, and may output an event signal (e.g., an on-event or off-event) corresponding to a result of the determination. After the DVS pixel back-end circuit 620 outputs the on-event or the off-event, the DVS pixel back-end circuit 620 may be reset by the reset signal RST. According to some example embodiments, the reference voltage may be a design parameter determined through empirical study.

Figure 7:
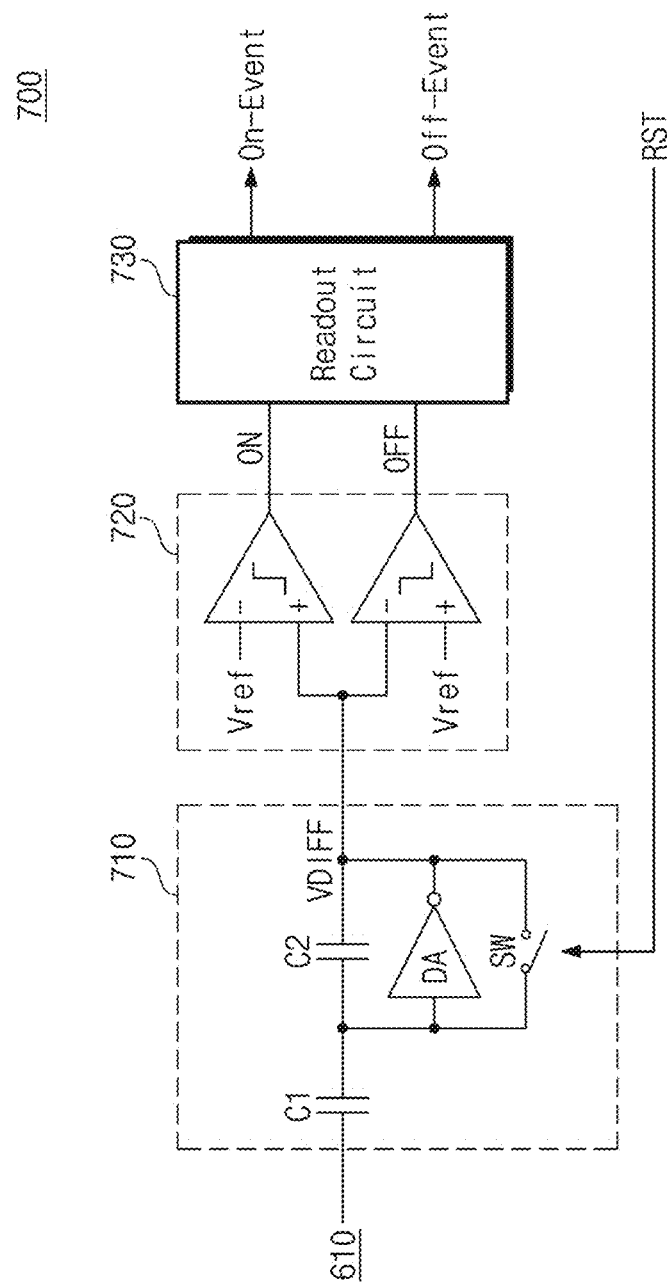
FIG. 7 illustrates an example configuration of a DVS pixel back-end circuit of FIG. 6.

FIG. 7 illustrates an example configuration of a DVS pixel back-end circuit of FIG. 6.

A DVS pixel back-end circuit 700 may include a differentiator 710, a comparator 720, and/or a readout circuit 730. According to some example embodiments, operations described herein as being performed by the DVS pixel back-end circuit 700, the comparator 720 and/or the readout circuit 730 may be performed by processing circuitry.

The differentiator 710 may be configured to amplify the voltage VLOG to generate a voltage VDIFF. For example, the differentiator 710 may include capacitors C1 and C2, a differential amplifier DA, and a switch SW, and the switch SW may operate in response to the reset signal RST. For example, the capacitors C1 and C2 may store electrical energy generated by at least one photoelectric conversion element PSD. For example, capacitances of the capacitors C1 and C2 may be appropriately selected in consideration of the shortest time (e.g., a refractory period) between two events that occur continuously at one pixel. When the switch SW is turned on by the reset signal RST, a pixel may be initialized (or reset). The reset signal RST may be received from the row AER circuit 524 (refer to FIG. 5).

The comparator 720 may compare a level of the output voltage VDIFF of the differential amplifier DA and a level of a reference voltage Vref and may determine whether an event that occurs at a pixel is an on-event or an off-event. When the event that the intensity of light increases is detected, the comparator 720 may output a signal ON indicating that the detected event is the on-event; when the event that the intensity of light decreases is detected, the comparator 720 may output a signal OFF indicating that the detected event is the off-event. According to some example embodiments, the reference voltage Vref may be a design parameter determined through empirical study.

The readout circuit 730 may output information about the event that occurs at the pixel. The information about the event output from the readout circuit 730 may include information (e.g., a bit) about whether the event that occurs is an on-event or an off-event. The information about the event output from the readout circuit 730 may be called the polarity information PI (refer to FIG. 5). The polarity information PI may be provided to the row AER circuit 524.

A configuration of a pixel illustrated in FIG. 7 is an example, and some example embodiments may be applied to various configurations of DVS pixels configured to determine a type of an event based on a result of detecting the intensity of light.

Figure 8:
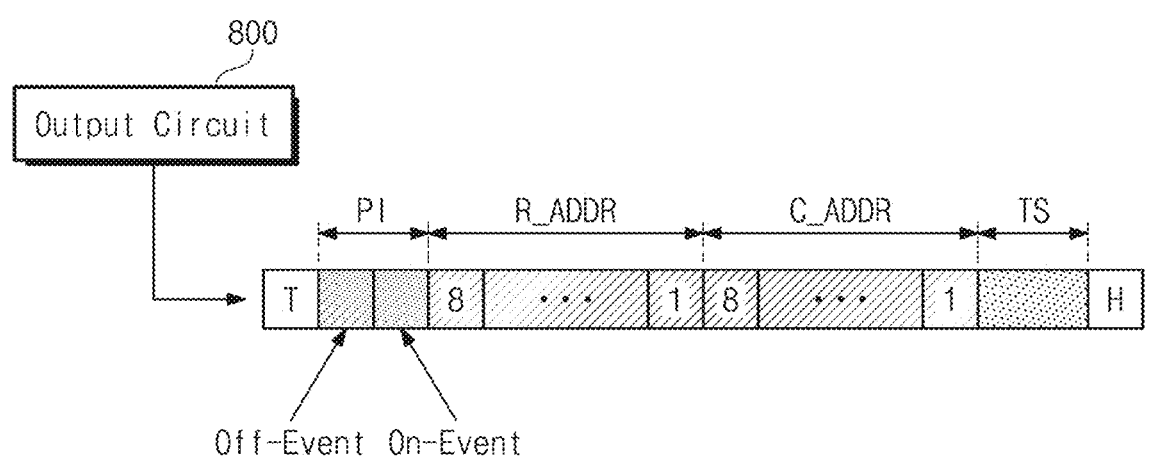
FIG. 8 illustrates an example format of a signal output from a dynamic vision sensor of the present disclosure.

FIG. 8 illustrates an example format of a signal output from a dynamic vision sensor of the present disclosure.

An output circuit 800 may correspond to the input/output circuit 526 of FIG. 5. The output circuit 800 may generate the event signal ES based on a signal output from the first region 512 (refer to FIG. 5), the column address C_ADDR output from the column AER circuit 522 (refer to FIG. 5), and/or the row address R_ADDR output from the row AER circuit 524 (refer to FIG. 5). The output circuit 800 may generate the noise signal NS based on a signal output from the second region 514 (refer to FIG. 5), the column address C_ADDR output from the column AER circuit 522 (refer to FIG. 5), and/or the row address R_ADDR output from the row AER circuit 524 (refer to FIG. 5). For example, the event signal ES and the noise signal NS may have the same format or similar formats.

Continuing to refer to FIG. 8, the signal output from the output circuit 800 may include the timestamp TS, the column address C_ADDR, the row address R_ADDR, and/or the polarity information PI. The signal output may also include a header H indicating a start of transmission of the signal and a tail T indicating an end of transmission of a signal.

The timestamp TS may include information about a time when an event occurs. For example, the timestamp TS may be composed of, but is not limited to, 32 bits.

Each of the column address C_ADDR and the row address R_ADDR may be composed of 8 bits. Therefore, a dynamic vision sensor that includes a plurality of pixels arranged in $2^8$ rows and $2^8$ columns may be supported. However, this is only an example, and the number of bits of the column address C_ADDR and the number of bits of the row address R_ADDR may be variously determined according to the number of pixels.

The polarity information PI may include information about an on-event and/or an off-event. In some example embodiments, the polarity information PI may be composed of a bit including information about whether an on-event occurs and a bit including information about whether an off-event occurs. For example, bit "1" may indicate that an event occurs, and bit "0" may indicate that an event does not occur. Therefore, the event that both the bit indicating an on-event and the bit indicating an off-event are "0" may occur, but the event that both the bit indicating an on-event and the bit indicating an off-event are "1" may not occur.

Figure 9:
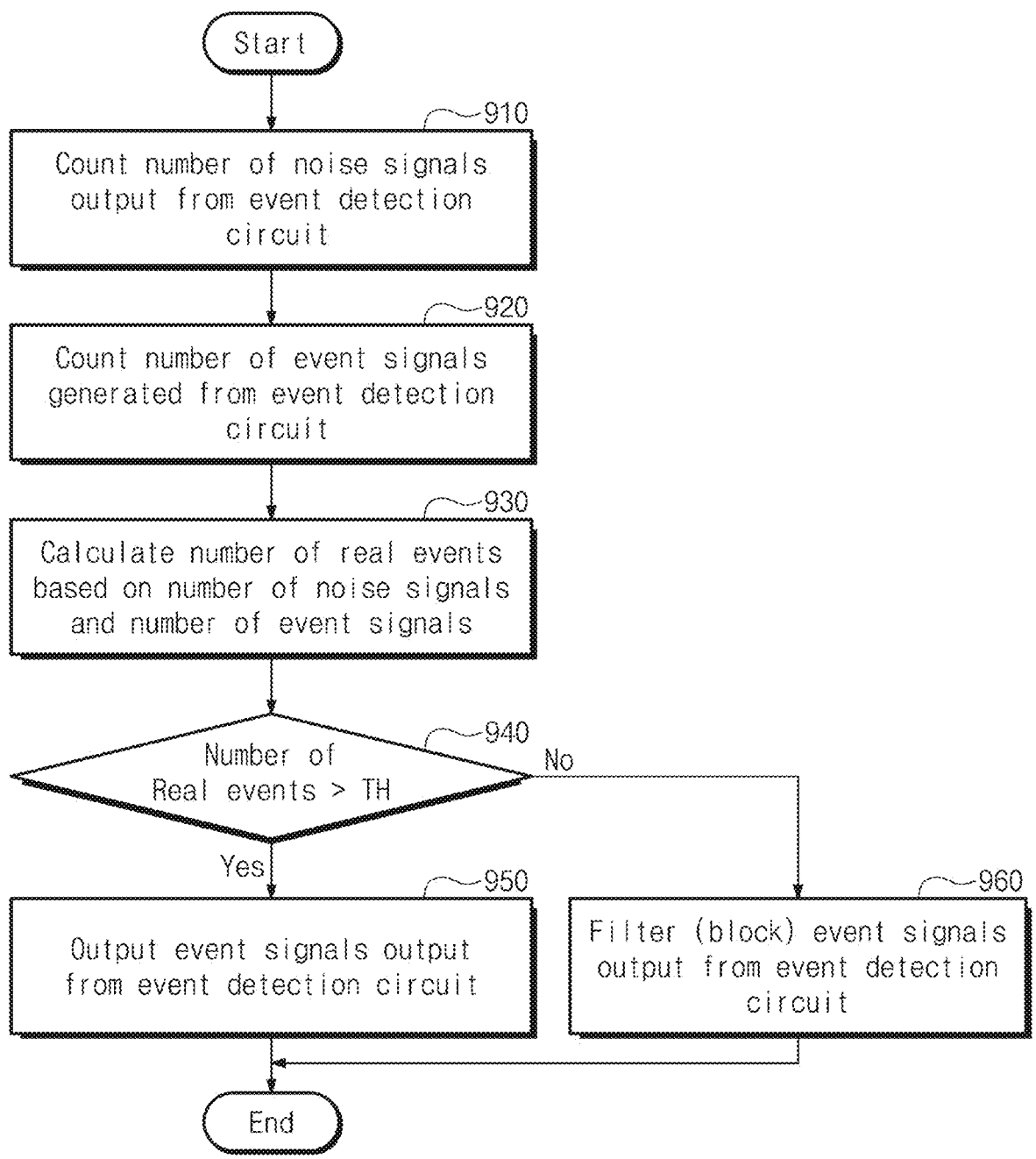
FIG. 9 is a flowchart illustrating an operating method of a dynamic vision sensor according to some example embodiments.

FIG. 9 is a flowchart illustrating an operating method of a dynamic vision sensor according to some example embodiments.

For ease of description, in the present example, it is assumed that the noise signals NS mean signals based on events output from one optical black region and the event signals ES mean signals based on events output from one active region. Below, a description will be given with reference to FIG. 5 together.

In operation 910, the event signal calibrator 530 may count the number of noise signals NS output from the event detection circuit 520 per unit time. The event signal ES and the noise signal NS have the same format or similar formats, but the event signal calibrator 530 may distinguish the event signal ES from the noise signal NS with reference to the row address R_ADDR and/or the column address C_ADDR.

In operation 920, the event signal calibrator 530 may count the number of event signals ES output from the event detection circuit 520 per unit time. Likewise, the event signal calibrator 530 may distinguish the event signal ES from the noise signal NS with reference to the row address R_ADDR and/or the column address C_ADDR.

In the present example, the description is given as an operation of counting noise signals is performed prior to an operation of counting event signals, but some example embodiments not limited thereto. For example, the operations of counting event signals and noise signals may be simultaneously or contemporaneously performed in parallel, or the operation of counting event signals may be performed prior to the operation of counting noise signals In operation 930, the number of events that occur really (that is, real events) may be calculated based on the number of noise signals NS and the number of event signals ES. As described above, because signals coming from noise are included in the event signals ES, the number of noise signals NS based on events that occur in an optical black region is considered as being already applied to the event signals ES based on events that occur in an active region.

In operation 940, the number of real events may be compared with the threshold value TH. The number of real events may be a value that is obtained by subtracting the number of noise signals NS from the number of event signals ES. When the number of real events is greater than the threshold value TH, operation 950 is performed; when the number of real events is smaller than the threshold value TH, operation 960 is performed.

In operation 950, the event signal calibrator 530 may output the event signals ES output from the event detection circuit 520 as the calibrated event signals CES. The calibrated event signals CES may be the same as or similar to the event signals ES before processing of the event signal calibrator 530.

In operation 960, the event signal calibrator 530 may filter (or block) the event signals ES output from the event detection circuit 520. That is, the calibrated event signals CES may be different from the event signals ES before processing of the event signal calibrator 530. In detail, because the calibrated event signals CES are considered as (e.g., reflect that) an event does not occur, all the bits of the polarity information PI (refer to FIG. 8) may be "0".

Figure 10:
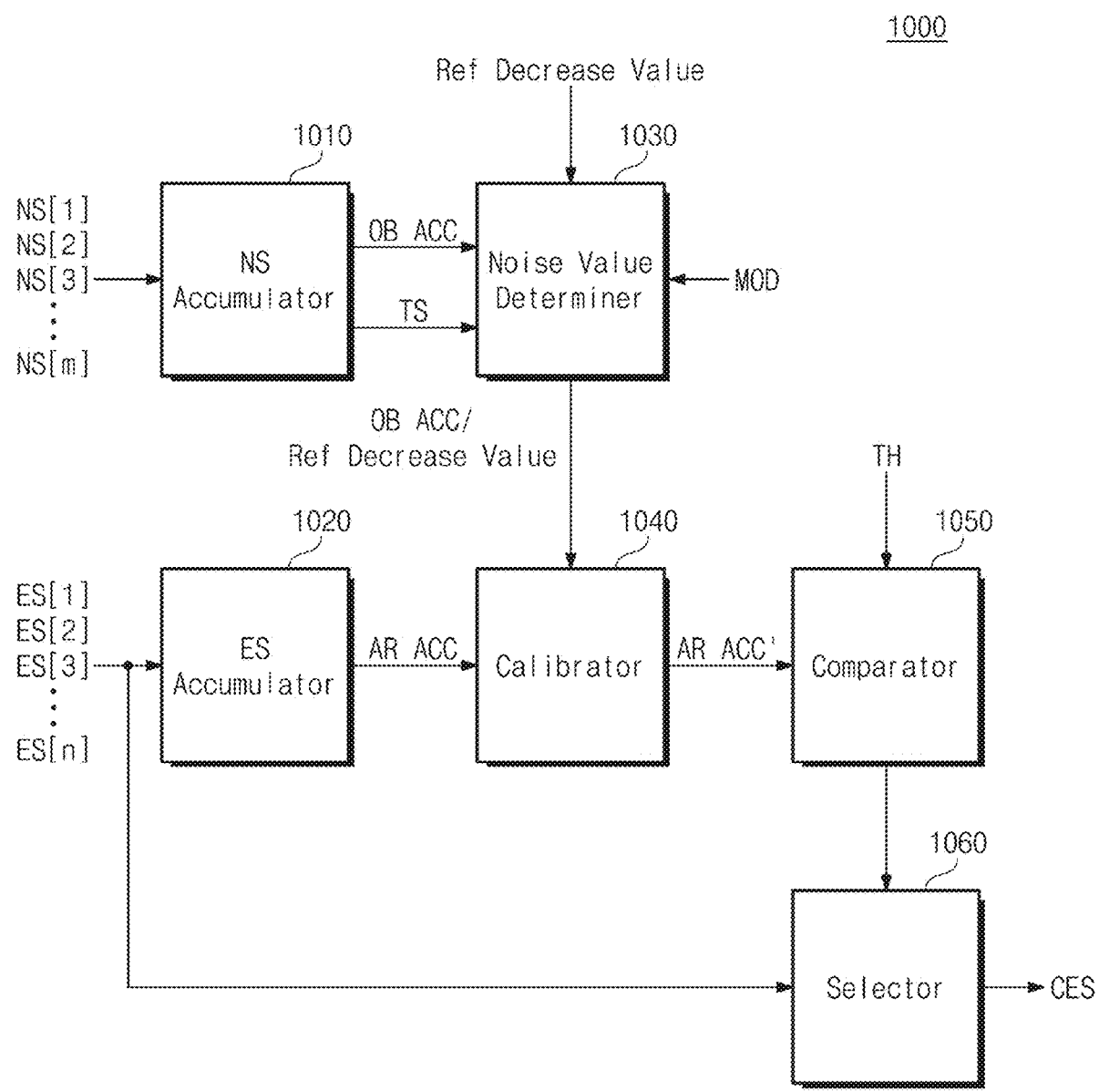
FIG. 10 illustrates an example configuration of an event signal calibrator illustrated in FIG. 5.

FIG. 10 illustrates an example configuration of the event signal calibrator 530 illustrated in FIG. 5.

For ease of description, in the present example, it is assumed that the noise signals NS[1] to NS[m] mean signals based on events output from one optical black region and event signals ES[1] to ES[n] mean signals based on events output from one active region.

An event signal calibrator 1000 may include a noise signal accumulator 1010, an event signal accumulator 1020, a noise value determiner 1030, a calibrator 1040, a comparator 1050, and/or a selector 1060. According to some example embodiments, operations described herein as being performed by the noise signal accumulator 1010, the event signal accumulator 1020, the noise value determiner 1030, the calibrator 1040, the comparator 1050, and/or the selector 1060 may be performed by processing circuitry.

The noise signal accumulator 1010 may accumulate (e.g., receive and/or store) the noise signals NS[1] to NS[m] (e.g., the noise signal NS[1], the noise signal NS[2], the noise signal NS[3] . . . the noise signal NS[m]) among noise signals output from the event detection circuit 520 (refer to FIG. 5) and may count the number of noise signals NS[1] to NS[m] thus accumulated. To this end, the noise signal accumulator 1010 may include a buffer and/or a memory and/or may be implemented with a buffer and/or a memory. The noise signal accumulator 1010 may output a counting signal OB ACC as a counting result (e.g., the noise signal accumulator 1010 may determine a number of noise signals included in received the noise signals NS[1] to NS[m]).

The event signal accumulator 1020 may accumulate (e.g., receive and/or store) the event signals ES[1] to ES[n] (e.g., the event signal ES[1], the event signal ES[2], the event signal ES[3] . . . the event signal ES[n]) among event signals output from the event detection circuit 520 and may count the number of event signals ES[1] to ES[n] thus accumulated. Likewise, the event signal accumulator 1020 may include a buffer and/or a memory and/or may be implemented with a buffer and/or a memory. The event signal accumulator 1020 may output a counting signal AR ACC as a counting result (e.g., the event signal accumulator 1020 may determine a number of event signals included in received the event signals ES[1] to ES[n]).

In some example embodiments, the event signal calibrator 1000 may further include a component configured to classify signals before the noise signal accumulator 1010 and the event signal accumulator 1020 process the signals. For example, this component may determine whether each event comes from the first region 512 (refer to FIG. 5) or the second region 514 (refer to FIG. 5), with reference to a column address and/or a row address included in each of noise signals and/or event signals. Depending on a result of the determination, the noise signals NS[1] to NS[m] may be provided to the noise signal accumulator 1010, and/or the event signals ES[1] to ES[n] may be provided to the event signal accumulator 1020. According to some example embodiments, operations described herein as being performed by the component may be performed by processing circuitry.

The noise value determiner 1030 may select one of the counting signal OB ACC and/or the reference decrease value. The signal OB ACC and the reference decrease value may correspond to noise output from each active region. In some example embodiments, the noise value determiner 1030 may output the reference decrease value in a first mode. For example, the reference decrease value may be a value that is determined in advance. In some example embodiments, a register, a memory, etc. may store the reference decrease value. In some example embodiments, the noise value determiner 1030 may output the counting signal OB ACC in a second mode. In some example embodiments, a mode control signal MOD may be used to change an operating mode of an electronic device that adopts the event signal calibrator 1000 of the present disclosure.

The noise value determiner 1030 may determine a calibration period of the calibrator 1040. In some example embodiments, the calibration period of the calibrator 1040 may be the same as or different from a period where a timestamp is generated. An operation of determining a calibration period of the calibrator 1040 will be described in detail below.

The calibrator 1040 may calculate the remaining real events other than false events from among the events, which occur in the active, based on the counting signals AR ACC and OB ACC. In other words, the calibrator 1040 may calculate a value related to real events among the event signals ES[1] to ES[n]. In some example embodiments, the calibrator 1040 may include a subtractor for performing a subtraction operation on the counting signals AR ACC and OB ACC (e.g., the calibrator 1040 may calculate the remaining real events by subtracting the number of noise signals from the number of event signals). The calibrator 1040 may output a signal AR ACC' as a result of the subtraction operation (e.g., the calibrator 1040 may output a value representing the remaining real events). According to some example embodiments, the calibrator 1040 may calculate the remaining real events other than false events from among the events, which occur in each active region (e.g., the active region AR1 to the active region AR9 of FIG. 3).

The comparator 1050 may compare the signal AR ACC' and the threshold value TH (e.g., the calibrator 1040 may determine whether the value representing the remaining real events is greater than or less than the threshold value). The comparator 1050 may output a signal for controlling the selector 1060, as a comparison result. When the signal AR ACC' is smaller than the threshold value TH, the event signals ES[1] to ES[n] may be considered as noise (even though events may really occur). In this case, the comparator 1050 may output a signal that allows the selector 1060 to select "0". In contrast, when the signal AR ACC' is greater than the threshold value TH, the signal AR ACC' may output a signal that allows the selector 1060 to select the event signals ES[1] to ES[n]. In other words, the comparison result of the comparator 1050 may direct the event signals ES[1] to ES[n] or "0".

The selector 1060 may select the event signals ES[1] to ES[n] or "0" based on the comparison result from the comparator 1050 and may output the calibrated event signal CES as a selection result. When the calibrated event signal CES is "0", information indicating that a movement of an object is absent in an active region from which events corresponding to the event signals ES[1] to ES[n] are output may be provided to the user.

Although not illustrated in drawings, the noise value determiner 1030 may further include a multiplier that makes it possible to perform a subtraction operation of the calibrator 1040 easily. For example, it is assumed that the counting signal OB ACC is 0.25. In this case, because the calibrator 1040 performs a subtraction operation using a decimal point, an operation may be complicated. To prevent the complicated operation, or to reduce the complexity of the operation, multipliers may be additionally provided for a multiplication operation for converting the counting signal OB ACC into an integer. For example, multipliers may be respectively provided on paths through which the counting signals OB ACC and AR ACC are transferred to the calibrator 1040. According to some example embodiments, operations described herein as being performed by the multiplier may be performed by processing circuitry.

Figure 11:
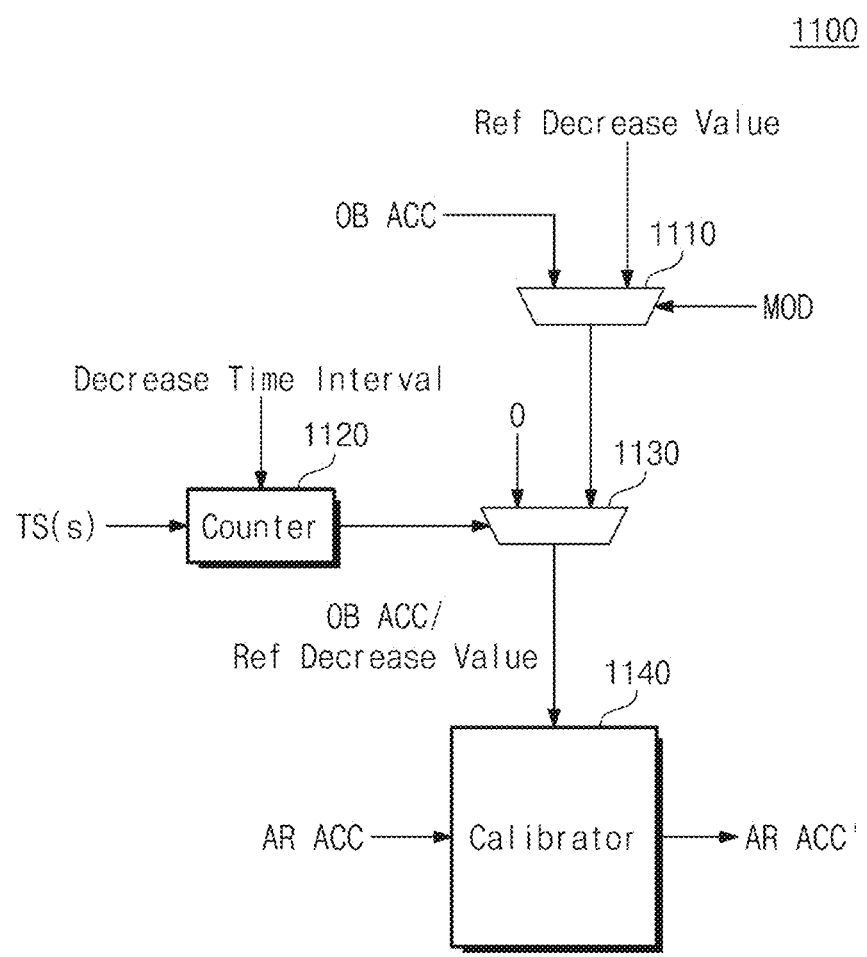
FIG. 11 illustrates an example configuration of a noise value determiner illustrated in FIG. 10.

FIG. 11 illustrates an example configuration of the noise value determiner 1030 illustrated in FIG. 10.

The noise value determiner 1030 may include a first multiplexer 1110, a counter 1120, and/or a second multiplexer 1130.

The first multiplexer 1110 may output one of the counting signal OB ACC and the reference decrease value in response to the mode control signal MOD. The reference decrease value may be a fixed value, and the counting signal OB ACC may be a value that varies with an output signal from an optical black region (e.g., OB1 to OB3 of FIG. 3) in real time. According to some example embodiments, the noise value determiner 1030 may receive the mode control signal MOD from a source external to the electronic device 100 and/or from processing circuitry of the electronic device 100.

The counter 1120 may determine a decrease period of the calibrator 1040. For example, the counter 1120 may count the timestamps TS as much as the number of times set by a decrease time interval, and may reset a counting value to "0" after counting the timestamps TS as much as the number of times thus set. For example, when the decrease time interval is 3, the counter 1120 may repeatedly perform a counting operation from 0 to 2 whenever the timestamps TS are received. A counting value may be input to the second multiplexer 1130. According to some example embodiments, operations described herein as being performed by the first multiplexer 1110, the second multiplexer 1130 and/or the counter 1120 may be performed by processing circuitry.

The second multiplexer 1130 may select an output value of the first multiplexer 1110 or "0", based on the counting value received from the counter 1120. For example, the second multiplexer 1130 may output "0" when the counting value received from the counter 1120 is not "0" and may select the output value of the first multiplexer 1110 when the counting value received from the counter 1120 is "0".

The output value of the second multiplexer 1130 may determine the decrease period of the calibrator 1040. In detail, when the counting value of the counter 1120 is not "0", because "0" selected by the second multiplexer 1130 is input to the calibrator 1040, the subtraction operation of the calibrator 1040 may not be substantially performed. As a result, the input and output values AR ACC and AR ACC' of the calibrator 1040 may be the same or similar. In contrast, when the counting value of the counter 1120 is "0", because the counting signal OB ACC or the reference decrease value selected by the first multiplexer 1110 is input to the calibrator 1040 through the second multiplexer 1130, the subtraction operation of the calibrator 1040 is performed. As a result, the input and output values AR ACC and AR ACC' of the calibrator 1040 may be different. According to some example embodiments, the decrease time interval may be a design parameter determined through empirical study.

Figure 12:
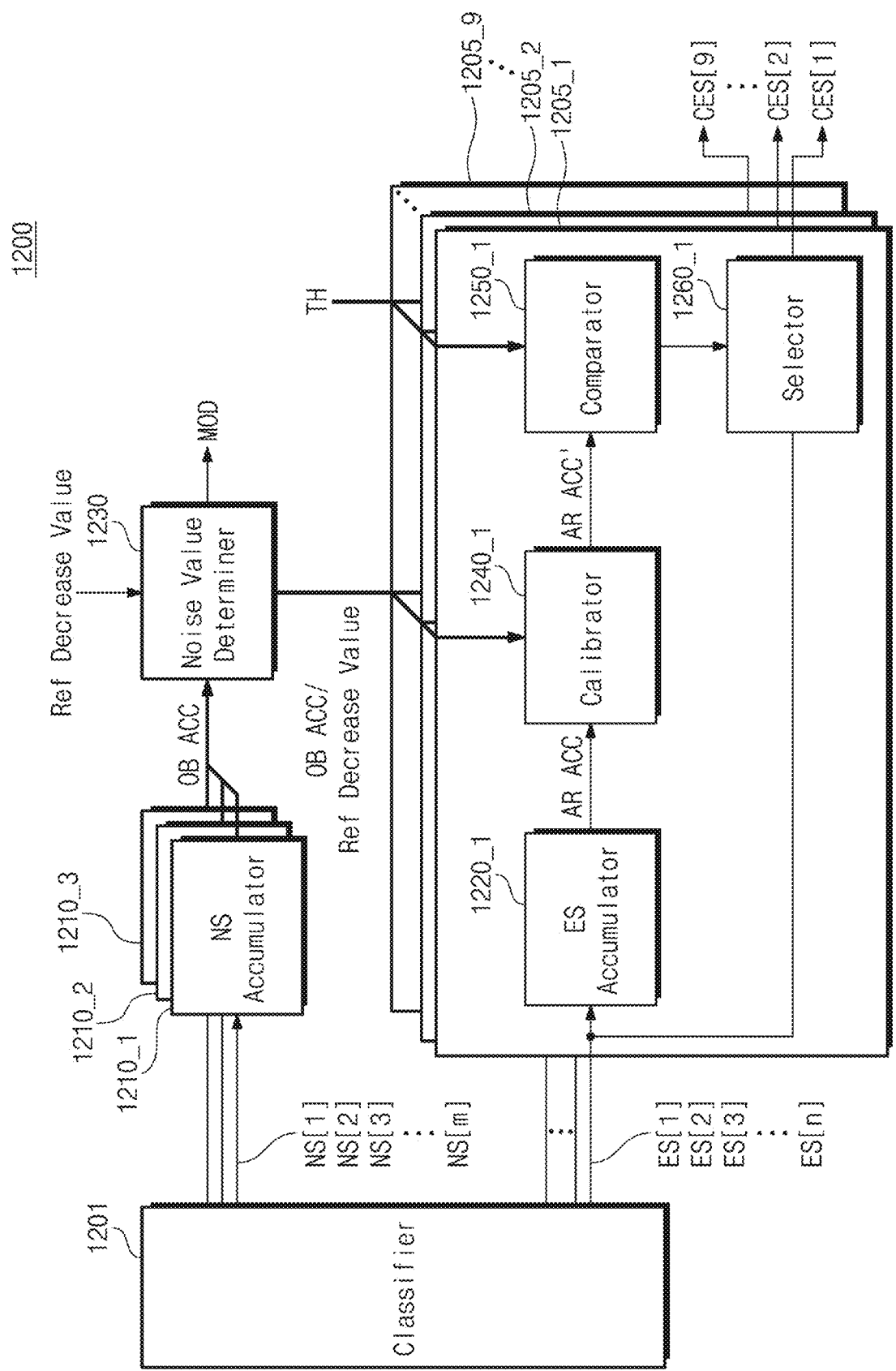
FIG. 12 illustrates an example configuration of an event signal calibrator illustrated in FIG. 5.

FIG. 12 illustrates an example configuration of the event signal calibrator 530 illustrated in FIG. 5.

The example configuration of FIG. 10 is mostly similar to the example configuration of FIG. 12. However, an event signal calibrator 1200 may be different from the event signal calibrator 1000 in that the event signal calibrator 1200 includes a classifier 1201, a plurality of noise signal accumulators (NSAs) 1210_1 to 1210_3 (e.g., the NSA 1210_1, the NSA 1210_2 and the NSA 1210_3), and/or a plurality of layers 1205_1 to 1205_9 (e.g., the layer 1205_1, the layer 1205_2, ... the layer 1205_9) each including an event signal accumulator (e.g., the event signal accumulator 1220_1), a calibrator (e.g., the calibrator 1240_1), a comparator (e.g., the comparator 1250_1), and/or a selector (e.g., the selector 1260_1). According to some example embodiments, each noise signal accumulator of the plurality of noise signal accumulators 1210_1 to 1210_3 may be the same as or similar to the noise signal accumulator 1010 described in association with FIG. 10. According to some example embodiments, each event signal accumulator (e.g., the event signal accumulator 1220_1), calibrator (e.g., the calibrator 1240_1), comparator (e.g., the comparator 1250_1) and/or selector (e.g., the selector 1260_1), of the plurality of layers 1205_1 to 1205_9, may be the same as or similar to the event signal accumulator 1020, the calibrator 1040, the comparator 1050 and/or the selector 1060 as described in association with FIG. 10. According to some example embodiments, operations described herein as being performed by the classifier 1201 may be performed by processing circuitry.

The classifier 1201 may receive the event signals ES and the noise signals NS from the event detection circuit 520 (refer to FIG. 5), in detail, from the input/output circuit 526 (refer to FIG. 5). The classifier 1201 may determine whether each event belongs to any of the active regions AR1 to AR9 (refer to FIG. 3) and/or the optical black regions OB1 to OB3 (refer to FIG. 3), with reference to row addresses and/or column addresses of the event signals ES and/or the noise signals NS. The noise signals classified according to a determination result may be provided to a relevant noise signal accumulator. For example, noise signals NS[1] to NS[m] corresponding to events classified as being generated in the first optical black region OB1 may be provided to the first noise signal accumulator 1210_1. As in the above description, the event signals classified according to the determination result may be provided to a relevant event signal accumulator. For example, the event signals ES[1] to ES[n] corresponding to events classified as being generated in the first active region AR1 may be provided to the first event signal accumulator 1220_1. The layers 1205_1 to 1205_9 may process the event signals ES[1] to ES[n] received from the active regions AR1 to AR9, respectively.

The noise signal accumulators 1210_1 to 1210_3 may generate the counting signal OB ACC by processing noise signals coming from events that occur in the optical black regions OB1 to OB3. The counting signal OB ACC may be an average value, the maximum value (e.g., the highest value), or the minimum value (e.g., the lowest value) of outputs of the noise signal accumulators 1210_1 to 1210_3.

An output value of a noise value determiner 1230 and the threshold value TH may be respectively input to the layers 1205_1 to 1205_9. Output values that are respectively processed by the layers 1205_1 to 1205_9 may be output as the calibrated event signals CES[1] to CES[9] (e.g., the calibrated event signal CES[1], the calibrated event signal CES[2], . . . the calibrated event signal CES [9]).

Figure 13:
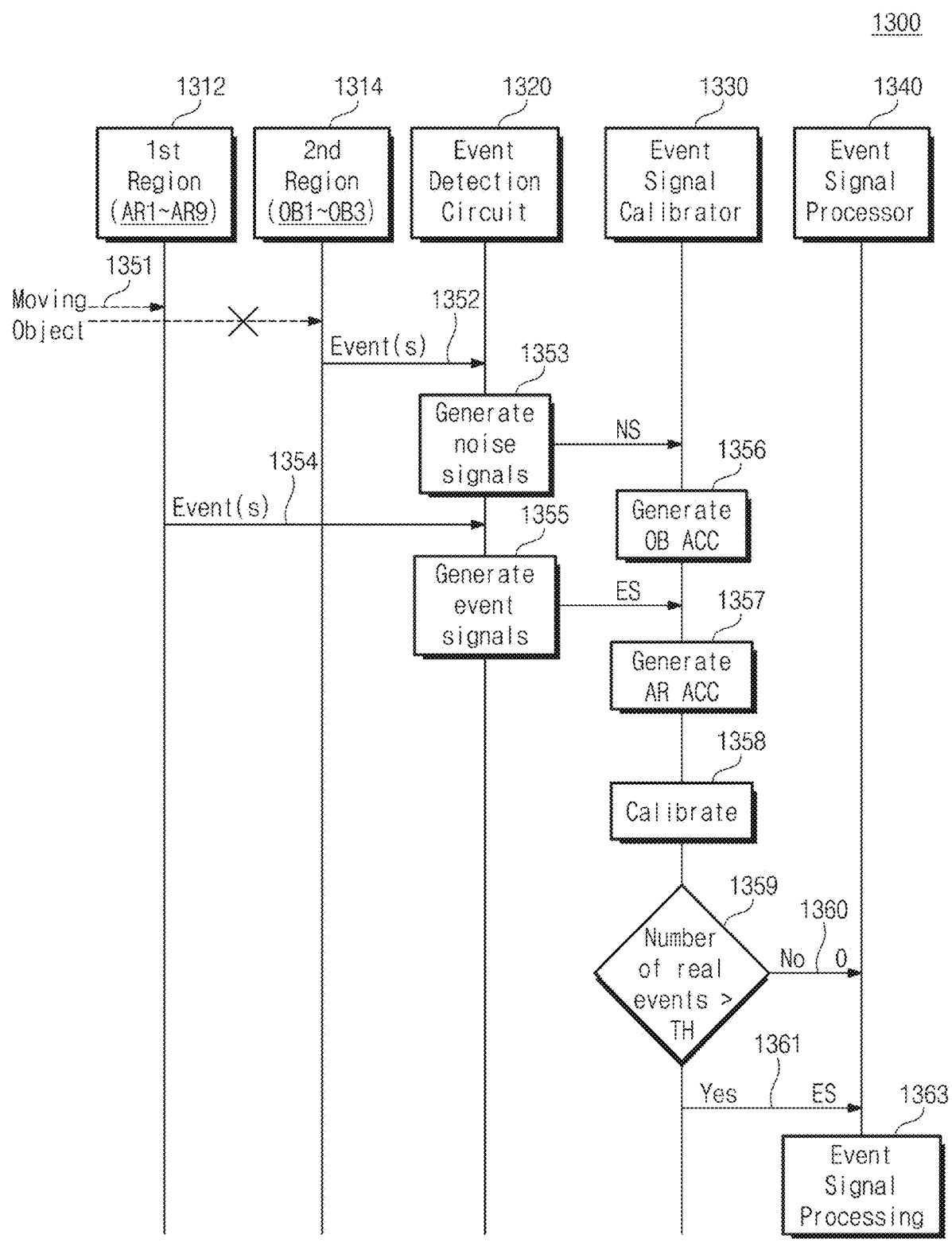
FIG. 13 is a flowchart illustrating an operating method of an electronic device according to some example embodiments.

FIG. 13 is a flowchart illustrating an operating method of an electronic device 1300 according to some example embodiments.

In operation 1351, a light, the intensity of which varies according to a moving object may be incident on a first region 1312. However, the light, the intensity of which varies, may not be incident on a second region 1314.

Even though the second region 1314 does not detect the light, the intensity of which varies, the second region 1314 may detect noise-based events, and the detected events may be provided to an event detection circuit 1320 (operation 1352). The event detection circuit 1320 may generate the noise signals NS based on the events received from the second region 1314 (operation 1353). Each noise signal may include an attribute of the event that occurs, information (e.g., a timestamp) about a time when the event occurs, an address of a pixel where the event is detected, etc. The event detection circuit 1320 may provide the generated noise signals NS to an event signal calibrator 1330.

Events that are detected in the first region 1312 may also be provided to the event detection circuit 1320 (operation 1354). The event detection circuit 1320 may generate the event signals ES based on the events received from the first region 1312 (operation 1355). Each event signal may include polarity information, a timestamp, an address of a pixel where an event occurs, etc. The event detection circuit 1320 may provide the generated event signals ES to the event signal calibrator 1330.

The event signal calibrator 1330 may generate the counting signal OB ACC based on the noise signals NS (operation 1356). The counting signal OB ACC may indicate the number of events that occur in each optical black region per unit time. The event signal calibrator 1330 may generate the counting signal AR ACC based on the event signals ES (operation 1357). The counting signal AR ACC may indicate the number of events that occur in each active region per unit time.

The event signal calibrator 1330 may perform calibration by performing a subtraction operation for the counting signals OB ACC and AR ACC (operation 1358). This complies with the assumption that false events occur in each active region as much as the number of false events that occur in each optical black region.

The event signal calibrator 1330 may compare the number of real events obtained according to a result of the calibration with the threshold value TH (operation 1359). When the number of real events is smaller than the threshold value TH (No), because the number of real events is relatively small, a relevant active region may be considered as a region where an event does not occur. Accordingly, the event signal calibrator 1330 may output "0" as a calibrated event signal (operation 1360). When the number of real events is greater than the threshold value TH (Yes), the event signal calibrator 1330 may output the event signals ES received from the event detection circuit 1320 as calibrated event signals without modification (operation 1361).

An event signal processor 1340 may perform event signal processing based on signals received from the event signal calibrator 1330 (operation 1363).

According to the some example embodiments, events determined as noise from among events detected in a DVS pixel array may be efficiently removed. As a result, the number of events that an event signal processor processes (e.g., false events) may decrease, thus improving a speed at which the event signal processor processes events (e.g., true events). In addition, power consumption of an electronic device that adopts the present disclosure may decrease.

Figure 14:
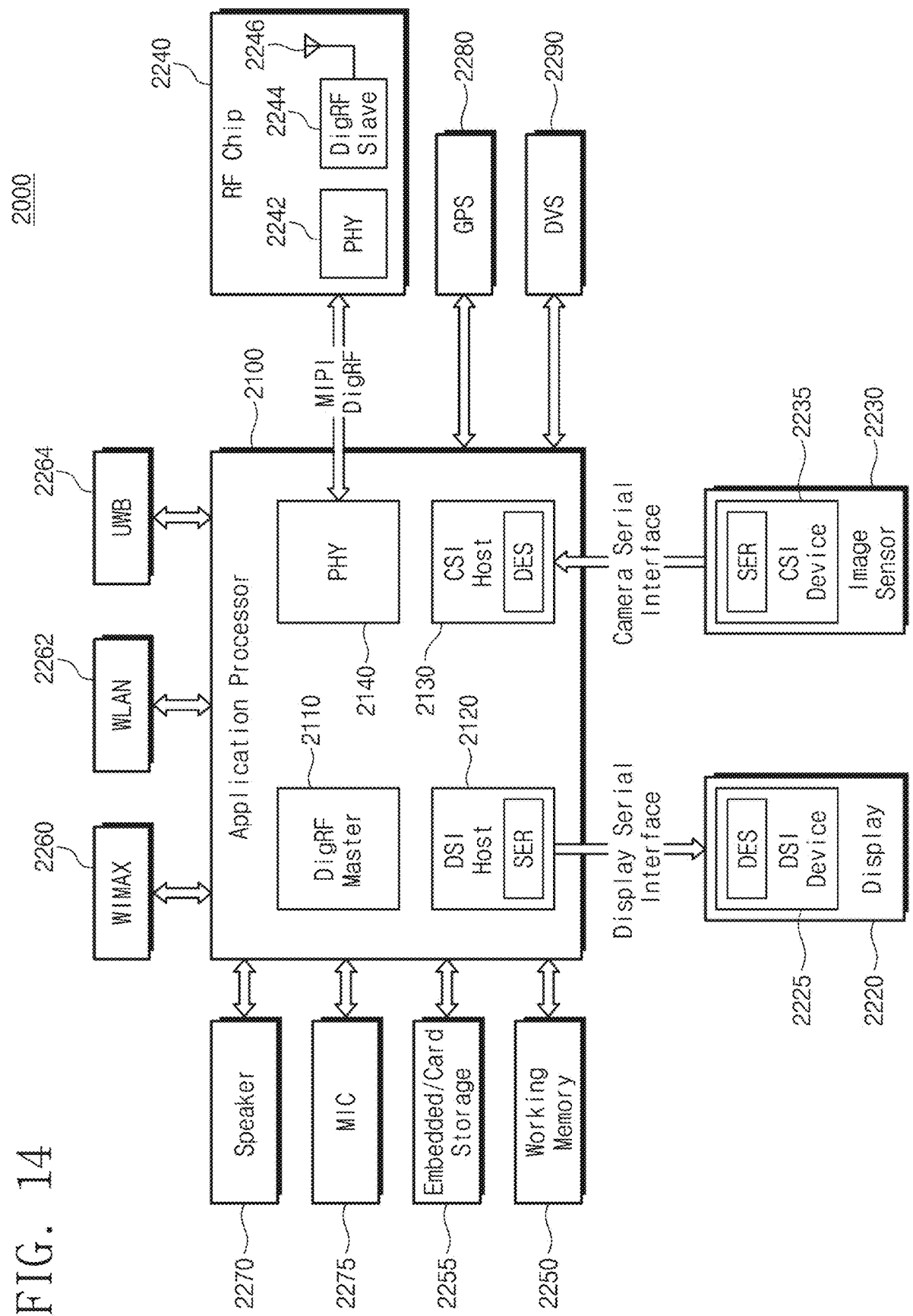
FIG. 14 illustrates an example configuration of an electronic system including a dynamic vision sensor according to some example embodiments.

FIG. 14 illustrates an example configuration of an electronic system including a dynamic vision sensor according to some example embodiments.

An electronic system 2000 may be implemented with a data processing device capable of using or supporting an interface proposed by mobile industry processor interface (MIPI) alliance. For example, the electronic system 2000 may be implemented with one of electronic devices, such as a digital camera, a video camcorder, a smartphone, a tablet, and/or a wearable device (e.g., a smart watch or a smart band).

The electronic system 2000 may include an application processor 2100, a display 2220, an image sensor 2230, and/or a dynamic vision sensor 2290. The application processor 2100 may include a DigRF master 2110, a display serial interface (DSI) host 2120, a camera serial interface (CSI) host 2130, and/or a physical layer 2140.

The DSI host 2120 may communicate with a DSI device 2225 of the display 2220 through the DSI. For example, an optical serializer SER may be implemented in the DSI host 2120. For example, an optical deserializer DES may be implemented in the DSI device 2225.

The CSI host 2130 may communicate with a CSI device 2235 of the image sensor 2230 through the CSI. For example, an optical deserializer DES may be implemented in the CSI host 2130. For example, an optical serializer SER may be implemented in the CSI device 2235.

The electronic system 2000 may further include a radio frequency (RF) chip 2240 for communicating with the application processor 2100. The RF chip 2240 may include a physical layer 2242, a DigRF slave 2244, and/or an antenna 2246. For example, the physical layer 2242 of the RF chip 2240 and the physical layer 2140 of the application processor 2100 may exchange data with each other in compliance with the DigRF interface supported by the MIPI alliance.

The electronic system 2000 may further include a working memory 2250 and/or embedded/card storage 2255. The working memory 2250 and/or the embedded/card storage 2255 may store data provided from the application processor 2100. In addition, the working memory 2250 and/or the embedded/card storage 2255 may provide the data stored therein to the application processor 2100. For example, the working memory 2250 and/or the embedded/card storage 2255 may store image data.

The working memory 2250 may temporarily store data processed or to be processed by the application processor 2100. The working memory 2250 may include a volatile memory such as a static random access memory (SRAM), a dynamic RAM (DRAM), and/or a synchronous DRAM (SDRAM) and/or a nonvolatile memory such as a flash memory, a phase-change RAM (PRAM), a magneto-resistive RAM (MRAM), a resistive RAM (ReRAM), and/or a ferro-electric RAM (FRAM).

The embedded/card storage 2255 may store data regardless of whether a power is supplied. The embedded/card storage 2255 may include one or more nonvolatile memories, a memory controller, and/or a buffer. For example, the embedded/card storage 2255 may include at least one of nonvolatile memories such as a flash memory, a PRAM, an MRAM, a ReRAM, and/or an FRAM. For example, the embedded/card storage 2255 may be devices such as a secure digital (SD) card and/or an embedded multimedia card (eMMC).

The electronic system 2000 may communicate with an external system through a communication module such as a worldwide interoperability for microwave access (WiMAX) 2260, a wireless local area network (WLAN) 2262, and/or an ultra-wideband (UWB) 2264. Even though the WiMAX 2260, the WLAN 2262 and the UWB 2264 are mentioned, the electronic system 2000 may further include various communication modules. The communication modules of the electronic system 2000 may transmit and/or receive an information signal and/or an image signal according to some example embodiments.

The electronic system 2000 may further include a speaker 2270 and/or a microphone 2275 (e.g., for processing voice information). The electronic system 2000 may further include a global positioning system (GPS) device 2280 for processing position information. The electronic system 2000 may include the dynamic vision sensor 2290 of the present disclosure. The dynamic vision sensor 2290 may be configured to calibrate event signals based on events output from active regions by using events output from optical black regions.

Circuits, chips, and devices according to some example embodiments may be mounted using various kinds of semiconductor packages. For example, circuits, chips, and devices according to some example embodiments may be mounted using a package: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), and/or wafer-level processed stack package (WSP).

According to some example embodiments, a device and a method capable of determining whether events that occur in an active region including a plurality of DVS pixels come from noise may be provided.

In detail, according to some example embodiments, when it is determined that events that occur in an active region come from noise, the events thus determined may not be output, thus improving the performance of a processor that processes an event signal.

In addition, power consumption of the processor that processes an event signal may decrease by preventing false event signals from being output or reducing the output thereof.

While some example embodiments been described, it will be apparent to those of ordinary skill in the art that various changes and modifications may be made thereto without departing from the spirit and scope of thereof as set forth in the following claims.

What is claimed is:

1. A dynamic vision sensor comprising:
    a dynamic vision sensor pixel array including an active region and an optical black region, the active region configured to output a plurality of first signals corresponding to a plurality of first events indicating a change in an intensity of light, and the optical black region configured to output a plurality of second signals corresponding to a plurality of second events not indicating the change in the intensity of light; and
    processing circuitry configured to,
        generate a plurality of event signals based on the plurality of first signals,
        generate a plurality of noise signals based on the plurality of second signals,
        calculate a value representing real events among the plurality of first events based on the plurality of event signals and the plurality of noise signals, and
        selectively output the plurality of event signals based on the value representing real events and a threshold value.

2. The dynamic vision sensor of claim 1, wherein
    each respective event signal among the plurality of event signals includes polarity information related to an attribute of a respective event among the plurality of first events, a timestamp indicating when the respective event occurs, and an address of a pixel in which the respective event is detected among a plurality of first pixels constituting the active region; and
    each respective noise signal among the plurality of noise signals includes polarity information related to an attribute of a respective second event among the plurality of second events, a timestamp indicating when the respective second event occurs, and an address of a pixel in which the respective second event is detected among a plurality of second pixels constituting the optical black region.

3. The dynamic vision sensor of claim 1, wherein the processing circuitry is configured to:
determine a number of first events included in the plurality of first events based on the plurality of event signals;
determine a number of second events included in the plurality of second events based on the plurality of noise signals; and
calculate the value representing real events by performing a subtraction operation on the number of first events and one of the number of second events or a reference decrease value.

4. The dynamic vision sensor of claim 3, wherein the processing circuitry is configured to select one of the number of second events or the reference decrease value in response to a mode control signal.

5. The dynamic vision sensor of claim 3, wherein the processing circuitry is configured to:
classify the plurality of event signals with reference to a plurality of first addresses of the active region at which the plurality of first events occur; and
classify the plurality of noise signals with reference to a plurality of second addresses of the optical black region at which the plurality of second events occur.

6. The dynamic vision sensor of claim 3, wherein the processing circuitry is configured to:
output the plurality of event signals in response to the value representing real events being greater than the threshold value; and
block the plurality of event signals from being output in response to the value representing real events being smaller than the threshold value.

7. The dynamic vision sensor of claim 6, wherein the threshold value is a value that is determined in advance.

8. The dynamic vision sensor of claim 6, wherein the threshold value is a value of the number of second events.

9. The dynamic vision sensor of claim 1, wherein a plurality of first pixels constituting the active region and a plurality of second pixels constituting the optical black region have a same structure.

10. The dynamic vision sensor of claim 9, wherein
each first pixel among the plurality of first pixels and each second pixel among the plurality of second pixels includes,
a photoelectric conversion element configured to generate photoelectrons in response to light,
a logarithmic amplifier configured to amplify a voltage corresponding to a photocurrent generated by the photoelectrons to generate an amplified voltage; and
the processing circuitry is configured to generate information about the change in the intensity of light based on the amplified voltage.

11. A dynamic vision sensor comprises:
a dynamic vision sensor pixel array including a plurality of active regions and a plurality of optical black regions, each active region among the plurality of active regions including a plurality of first pixels, and each optical black region among the plurality of optical black regions including a plurality of second pixels; and
processing circuitry configured to,
generate a plurality of event signals based on a plurality of first events detected by the plurality of first pixels of a first active region among the plurality of active regions,
generate a plurality of noise signals based on a plurality of second events detected by the plurality of second pixels of a first optical black region among the plurality of optical black regions,
determine a number of first events included in the plurality of first events based on the plurality of event signals,
determine a number of second events included in the plurality of second events based on the plurality of noise signals,
perform a subtraction operation on the number of first events and one of the number of second events or a reference decrease value to generate a value representing real events among the plurality of first events, and
selectively output the plurality of event signals based on the value representing real events and a threshold value.

12. The dynamic vision sensor of claim 11, wherein the processing circuitry is configured to:
output the plurality of event signals in response to the value representing real events being greater than the threshold value; and
block the plurality of event signals from being output in response to the value representing real events being smaller than the threshold value.

13. The dynamic vision sensor of claim 11, wherein the processing circuitry is configured to select the one of the number of second events or the reference decrease value in response to a mode control signal.

14. The dynamic vision sensor of claim 11, wherein a number of the plurality of first pixels of the first active region is identical to a number of the plurality of second pixels of the first optical black region.

15. The dynamic vision sensor of claim 11, wherein the threshold value is a value of the number of second events.

16. A method of operating a dynamic vision sensor which includes an active region and an optical black region, the method comprising:
detecting, by the active region, a plurality of first events indicating a change in an intensity of light;
detecting, by the optical black region, a plurality of second events not indicating the change in the intensity of light;
generating a plurality of event signals based on the plurality of first events;
generating a plurality of noise signals based on the plurality of second events;
determining real events among the plurality of first events by performing a subtraction operation based on the plurality of event signals and the plurality of noise signals; and
selectively output the plurality of event signals based on a result of the determining and a threshold value.

17. The method of claim 16, wherein the determining includes:
determining a number of first events included in the plurality of first events based on the plurality of event signals;
determining a number of second events included in the plurality of second events based on the plurality of noise signals;

performing a subtraction operation on the number of first events and the number of second events to generate a value representing the real events; and selectively outputting the plurality of event signals based on the value representing the real events and the threshold value.

18. The method of claim 17, further comprising:

classifying the plurality of event signals with reference to a plurality of first addresses of the active region at which the first events occur; and classifying the plurality of noise signals with reference to a plurality of second addresses of the optical black region at which the second events occur.

19. The method of claim 17, wherein the selectively outputting includes:

outputting the plurality of event signals in response to value representing the real events being greater than the threshold value; and blocking the plurality of event signals from being output in response to value representing the real events being smaller than the threshold value.

20. The method of claim 17, wherein the threshold value is a value of number of second events.

\* \* \* \* \*